(12) United States Patent
Osawa et al.

(10) Patent No.: US 10,408,700 B2
(45) Date of Patent: Sep. 10, 2019

(54) OIL PRESSURE SENSOR ATTACHING STRUCTURE

(71) Applicant: Nidec Tosok Corporation, Zama-shi, Kanagawa (JP)

(72) Inventors: Tomoka Osawa, Zama (JP); Hironobu Wakabayashi, Zama (JP); Toshiaki Nakamura, Zama (JP); Hiroshi Tatsuta, Zama (JP)

(73) Assignee: NIDEC TOSOK CORPORATION, Kanagawa (JP)

( * ) Notice: Subject to any disclaimer, the term of this patent is extended or adjusted under 35 U.S.C. 154(b) by 232 days.

(21) Appl. No.: 15/713,753

(22) Filed: Sep. 25, 2017

(65) Prior Publication Data

US 2018/0087990 A1    Mar. 29, 2018

(30) Foreign Application Priority Data

Sep. 26, 2016   (JP) .................................. 2016-186931

(51) Int. Cl.
*G01L 19/00*   (2006.01)
*G01L 19/14*   (2006.01)
*B81B 7/00*    (2006.01)

(52) U.S. Cl.
CPC .......... *G01L 19/147* (2013.01); *G01L 19/003* (2013.01); *G01L 19/0084* (2013.01);
(Continued)

(58) Field of Classification Search
CPC . B81B 7/00; B81B 7/0051; B81B 2201/0264; G01L 19/00; G01L 19/003;
(Continued)

(56) References Cited

U.S. PATENT DOCUMENTS

| 8,739,642 B2 * | 6/2014 | Horn | G01D 21/00 374/E1.018 |
|---|---|---|---|
| 2005/0193809 A1 * | 9/2005 | Matsumura | G01L 19/0007 73/114.38 |

(Continued)

FOREIGN PATENT DOCUMENTS

| EP | 1837631 A1 * | 9/2007 | G01D 11/30 |
|---|---|---|---|
| JP | 63215847 A * | 9/1988 | F02D 35/00 |

(Continued)

*Primary Examiner* — Nguyen Q. Ha
(74) *Attorney, Agent, or Firm* — Keating & Bennett, LLP (57) ABSTRACT

According to an aspect of the present invention, there is provided an oil pressure sensor attaching structure in which a plurality of guide protrusion portions are disposed with a gap in a circumferential direction and surround an oil passage opening portion. The guide protrusion portions have an arc-shaped wall portion and a protrusion portion. An accommodation portion which has an accommodation opening portion opening upward is provided on an inside of the plurality of guide protrusion portions in a radial direction. The sensor has a sensor case which has a columnar portion, a plurality of flange portions, and an annular portion that surrounds the columnar portion. The flange portion is disposed between an upper surface of an oil passage body and the protrusion portions in the vertical direction at a first position in the circumferential direction. The annular portion has a first portion and a second portion.

7 Claims, 5 Drawing Sheets

(52) U.S. Cl.
CPC .......... *G01L 19/143* (2013.01); *B81B 7/0051* (2013.01); *B81B 2201/0264* (2013.01); *H01L 2224/48091* (2013.01)

(58) Field of Classification Search
CPC ... G01L 19/0084; G01L 19/14; G01L 19/143; G01L 19/147; H01L 2224/48091
See application file for complete search history.

(56) References Cited

U.S. PATENT DOCUMENTS

| | | |
|---|---|---|
| 2010/0186830 A1 | 7/2010 | Shigyo et al. |
| 2015/0137281 A1 | 5/2015 | Imai et al. |

FOREIGN PATENT DOCUMENTS

| | | |
|---|---|---|
| JP | 2010-174991 A | 8/2010 |
| JP | 2015-096843 A | 5/2015 |

\* cited by examiner

OIL PRESSURE SENSOR ATTACHING STRUCTURE

CROSS REFERENCE TO RELATED APPLICATIONS

This application claims the benefit of priority to Japanese Patent Application No. 2016-186931 filed on Sep. 26, 2016. The entire contents of this application are hereby incorporated herein by reference.

BACKGROUND OF THE INVENTION

1. Field of the Invention

The present invention relates to an oil pressure sensor attaching structure.

2. Description of the Related Art

An oil pressure control device including an oil pressure sensor is known.

For example, as disclosed in Japanese Unexamined Patent Application Publication No. 2010-174991, an oil pressure sensor is attached to a control valve in which an oil passage is provided.

As a method for attaching the oil pressure sensor to the control valve as described above, there is a method for attaching the oil pressure sensor from an outside portion of the control valve. As such a method, for example, there are a method in which a male screw portion is provided in the oil pressure sensor and the male screw portion of the oil pressure sensor is tightened from the outside portion of the control valve into a female screw hole provided in the control valve, a method for fixing the oil pressure sensor to the control valve using another attaching member, and the like.

Here, in the oil pressure control device, since high pressure is applied from the oil which is a target to be measured to the oil pressure sensor, it is necessary to sufficiently increase an attaching strength of the oil pressure sensor to the control valve. Accordingly, in a case where the method of tightening the male screw portion of the oil pressure sensor into the female screw hole of the control valve is used as described above, since it is necessary to sufficiently lengthen the length of engagement between the screw portions, the oil pressure sensor is likely to be large in size. In addition, in a case where another attaching member is used, the attaching member is likely to be large in size so as to secure the attaching strength of the oil pressure sensor. Therefore, there is a problem that the entire oil pressure control device is likely to be large in size so as to sufficiently secure the attaching strength of the oil pressure sensor.

In view of the above problems, an object of the present invention is to provide an oil pressure sensor attaching structure that can suppress an increase in the size of the entire oil pressure control device while securing the attaching strength of an oil pressure sensor.

SUMMARY OF THE INVENTION

According to an aspect of the present invention, there is provided an oil pressure sensor attaching structure in which an oil pressure sensor which measures pressure of oil flowing in an oil passage through which oil flows is attached to an upper surface of an oil passage body having the oil passage therein, in which the oil passage body has an oil passage opening portion that is connected to the oil passage on the upper surface, in which the oil pressure sensor has a sensor main body and a sensor case that covers the sensor main body, in which the sensor case has a sensing hole that is connected to the oil passage opening portion on a lower surface of the sensor case in a state where the oil pressure sensor is attached to the upper surface, in which the oil pressure sensor attaching structure includes a plurality of guide protrusion portions which are disposed on the upper surface; and the sensor case, in which the plurality of guide protrusion portions are disposed with a gap in a circumferential direction of a central axis extending in a vertical direction and surround the oil passage opening portion, in which the guide protrusion portions have an arc-shaped wall portion that protrudes upward from the upper surface and extends in a circumferential direction, and a protrusion portion that protrudes from the wall portion to an inside in a radial direction, in which an accommodation portion which has an accommodation opening portion opening upward is provided on an inside of the plurality of guide protrusion portions in the radial direction, in which the accommodation portion is capable of accommodating the sensor case from an upper side via the accommodation opening portion and allows the sensor case to be rotated about the central axis in a state where the sensor case is inserted into the accommodation portion, in which the sensor case has a columnar portion that extends from the accommodation portion via the accommodation opening portion to an upper side of the wall portion, in a state where the sensor case is inserted into the accommodation portion, a plurality of flange portions that protrude from the columnar portion to an outside in the radial direction and are disposed with a gap in the circumferential direction, and an annular portion that surrounds the columnar portion on an upper side of the flange portion, in which the flange portions are disposed between the upper surface and the protrusion portions in the vertical direction at a first position in the circumferential direction, and in which the annular portion has a first portion which is positioned on an upper side of the guide protrusion portion when the flange portions are disposed at the first position, and a second portion which is disposed on a lower side of the first portion and is disposed in a gap between the guide protrusions adjacent to each other in the circumferential direction when the flange portion is positioned at the first position.

The above and other elements, features, steps, characteristics, and advantages of the present invention will become more apparent from the following detailed description of the preferred embodiments with reference to the attached drawings.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE PREFERRED EMBODIMENTS

In each drawing, a Z-axis direction is referred to as a vertical direction Z. An X-axis direction is referred to as a left-right direction (first direction) X between horizontal directions orthogonal to the vertical direction Z. A Y-axis direction is referred to as a front-rear direction Y orthogonal to the left-right direction X between the horizontal directions orthogonal to the vertical direction Z. A positive side of the vertical direction Z is referred to as "an upper side" and a negative side thereof is referred to as "a lower side". The upper side, the lower side, the vertical direction, the left-right direction, and the front-rear direction are names for simply explaining relative positional relationships between the respective portions and do not limit actual disposition relationships or the like.

Figure 1:
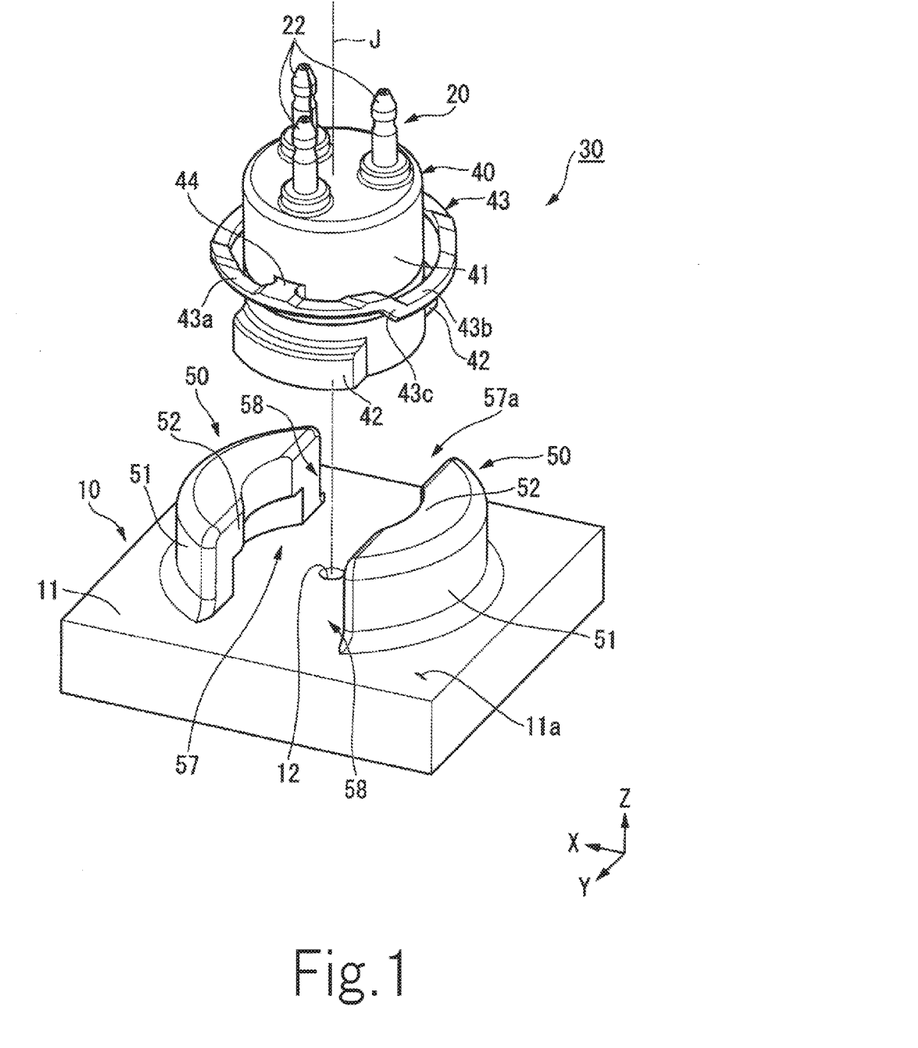
FIG. 1 is a perspective view illustrating an oil pressure sensor attaching structure of the present embodiment.
Figure 2:
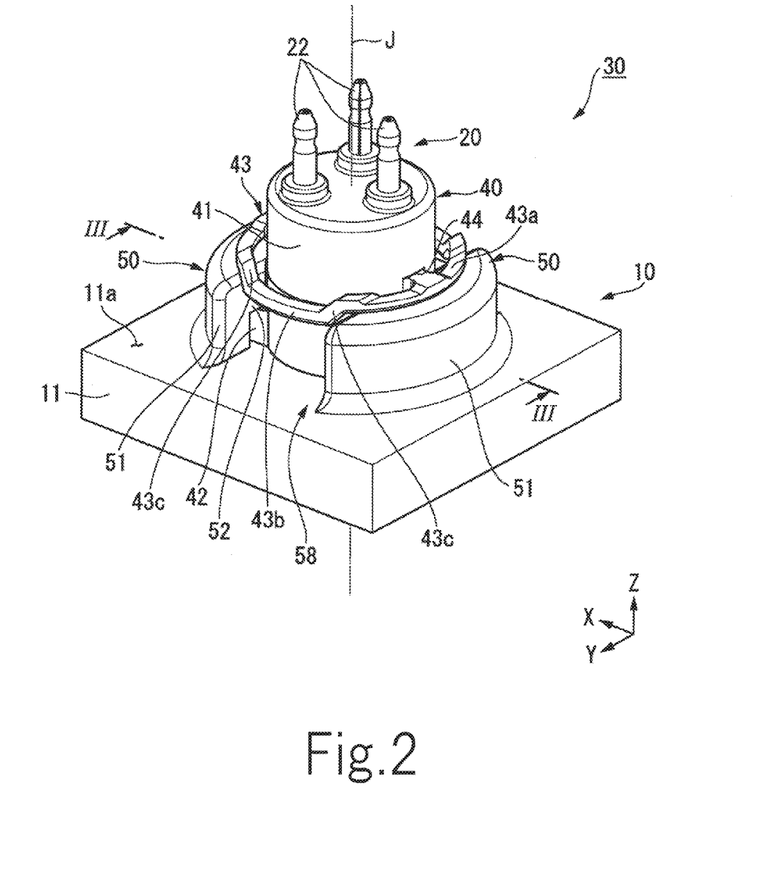
FIG. 2 is a perspective view illustrating the oil pressure sensor attaching structure of the present embodiment.
Figure 3:
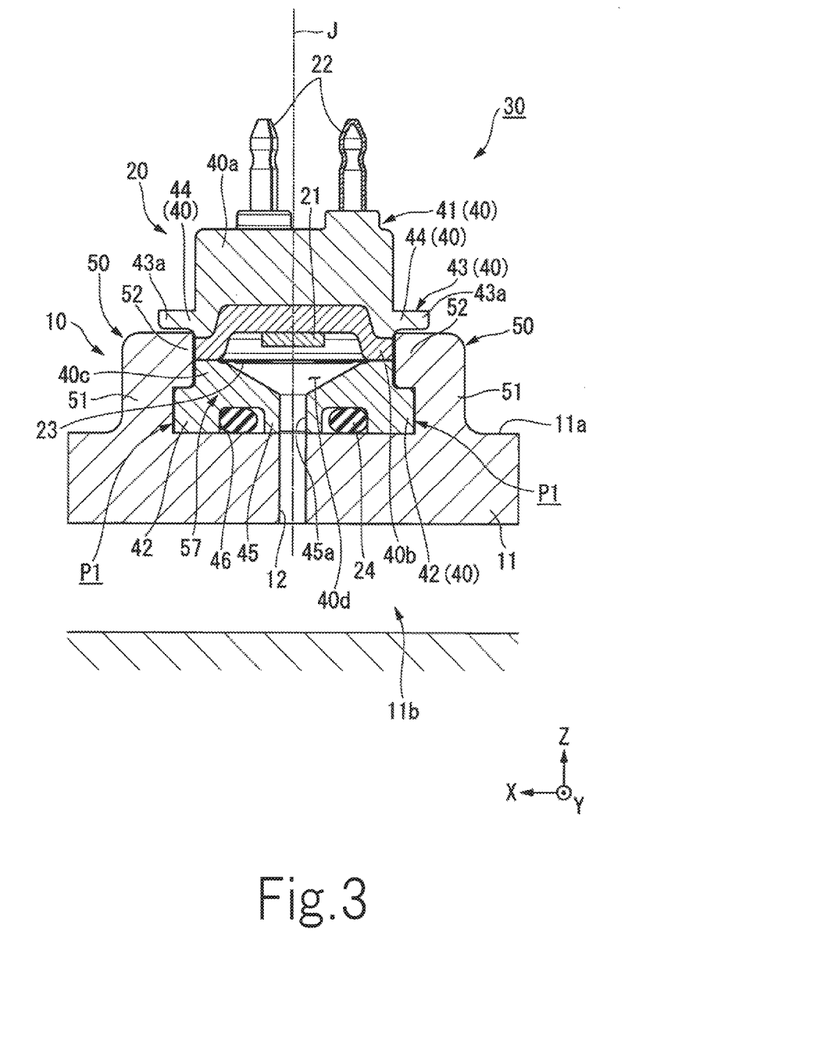
FIG. 3 is a view illustrating the oil pressure sensor attaching structure of the present embodiment and is a sectional view taken along line III-III in FIG. 2.

In an oil pressure sensor attaching structure 30 of the present embodiment illustrated in FIG. 1 to FIG. 3, an oil pressure sensor 20 is attached to a control valve 10 of an oil pressure control device. More specifically, in the oil pressure sensor attaching structure 30, the oil pressure sensor 20 is attached to an upper surface 11a of an oil passage body 11 of the control valve 10. As illustrated in FIG. 3, the oil passage body 11 has an oil passage 11b through which oil flows therein. The oil pressure sensor 20 measures the pressure of oil flowing in the oil passage 11b. The oil passage body 11 has an oil passage opening portion 12 connected to the oil passage 11b on the upper surface 11a. As illustrated in FIG. 1, in the present embodiment, the oil passage opening portion 12 has a circular shape about a central axis J extending in the vertical direction Z.

In the following description, a side closer to the central axis J in the left-right direction X is referred to as "an inside in the left-right direction" and a side far from the central axis J in the left-right direction is referred to as "an outside in the left-right direction". In addition, a radial direction about the central axis J is simply referred to as "a radial direction" and a circumferential direction about the central axis J is simply referred to as "a circumferential direction".

FIG. 1 illustrates a state before the oil pressure sensor 20 is attached to the upper surface 11a of the oil passage body 11. FIG. 2 and FIG. 3 illustrate a state where the oil pressure sensor 20 is attached to the upper surface 11a of the oil passage body 11 by the oil pressure sensor attaching structure 30. A state before the oil pressure sensor 20 is attached to the upper surface 11a of the oil passage body 11 is referred to as "a non-mounted state" and a state where the oil pressure sensor 20 is attached to the upper surface 11a of the oil passage body 11 by the oil pressure sensor attaching structure 30 is referred to as "a mounted state". The oil pressure sensor attaching structure 30 includes a plurality of guide protrusion portions 50 of the control valve 10 and a sensor case 40 of the oil pressure sensor 20.

As illustrated in FIG. 1, the plurality of guide protrusion portions 50 are disposed on the upper surface 11a of the oil passage body 11. The plurality of guide protrusion portions 50 are disposed with a gap 58 in the circumferential direction of the central axis J extending in the vertical direction Z. The plurality of guide protrusion portions 50 surround the oil passage opening portion 12. In the present embodiment, two guide protrusion portions 50 are provided so as to face each other in the left-right direction X.

The guide protrusion portion 50 includes a wall portion 51 and a protrusion portion 52. The wall portion 51 protrudes upward from the upper surface 11a of the oil passage body 11. A shape of the wall portion 51 is an arc shape extending in the circumferential direction. In the present embodiment, the shapes of the two wall portions 51 have an arc shape that protrudes to an outside in the left-right direction, respectively. The protrusion portion 52 protrudes to an inside from the wall portion 51 in the radial direction. More specifically, the protrusion portion 52 protrudes to an inside from an upper end of the wall portion 51 in the radial direction. The protrusion portion 52 extends in the circumferential direction. In the present embodiment, the protrusion portion 52 extends from one end of the wall portion 51 in the circumferential direction to the other end thereof in the circumferential direction.

An accommodation portion 57 is provided on an inside of the plurality of guide protrusion portions 50 in the radial direction. In the present embodiment, the accommodation portion 57 is provided between the two guide protrusion portions 50 in the left-right direction X. The accommodation portion 57 has an accommodation opening portion 57a opening upward. The accommodation portion 57 can accommodate the sensor case 40 from the upper side via the accommodation opening portion 57a. The accommodation portion 57 opens to the gap 58 between the guide protrusion portions 50 in the circumferential direction. In the present embodiment, the accommodation portion 57 is open at both ends in the front-rear direction Y. The accommodation portion 57 allows the sensor case 40 to be rotated about the central axis J in a state where the sensor case 40 is inserted into the accommodation portion 57.

Figure 4:
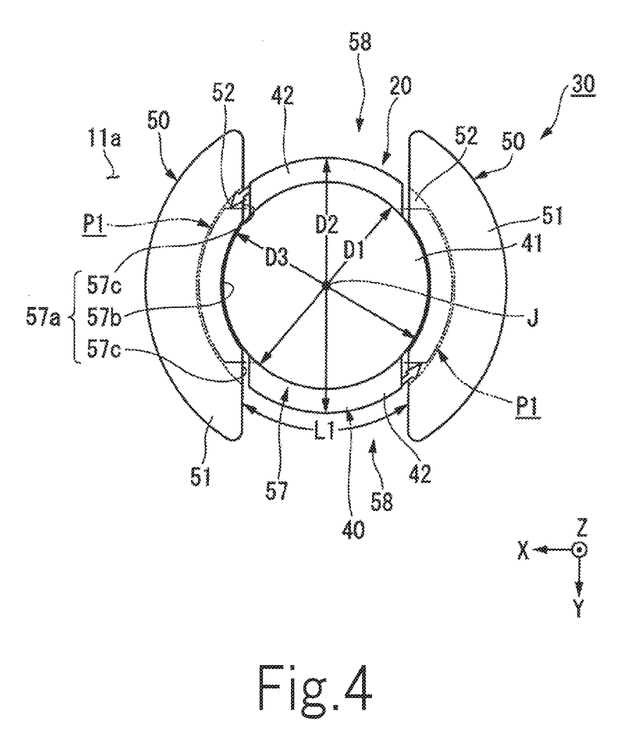
FIG. 4 is a plan view illustrating the oil pressure sensor attaching structure of the present embodiment.

As illustrated in FIG. 4, the accommodation opening portion 57a has a first accommodation opening portion 57b and a plurality of second accommodation openings portions 57c. The first accommodation opening portion 57b is disposed an inside of the protrusion portion 52 in the radial direction. A shape of the first accommodation opening portion 57b viewed from an upper side is a circular shape about the central axis J. A columnar portion 41 of the sensor case 40 to be described below can be inserted into the first accommodation opening portion 57b from the upper side.

The second accommodation opening portion 57c is disposed between the protrusion portions 52 of the guide protrusion portions 50 that are adjacent to each other in the circumferential direction. The second accommodation opening portion 57c is continuously provided on the outside of the first accommodation opening portion 57b in the radial direction. In the present embodiment, the second accommodation opening portion 57c is provided continuously on both sides of the first accommodation opening portion 57b in the front-rear direction Y, respectively. In other words, two second accommodation openings portions 57c are provided so as to face each other in a state where the first accommodation opening portion 57b is interposed therebetween. A shape of the second accommodation opening portion 57c viewed from the upper side is an arc shape extending in the circumferential direction. A plurality of flange portions 42 to be described below can be inserted into the plurality of second accommodation openings portions 57c from the upper side, respectively. In FIG. 4, a solid line indicates a non-mounted state, and a two-dot chain line indicates a mounted state.

As illustrated in FIG. 3, the oil pressure sensor 20 has a sensor case 40, a sensor main body 21, a connection terminal 22, a diaphragm 23, and an O-ring 24. The sensor case 40 covers the sensor main body 21. As illustrated in FIG. 1, the sensor case 40 has a columnar portion 41, a plurality of flange portions 42, an annular portion 43, and a connection portion 44.

The columnar portion 41 extends in the vertical direction Z. In the present embodiment, a shape of the columnar portion 41 is a columnar shape extending in the vertical direction Z. In the mounted state, the columnar portion 41 is disposed about the central axis J. The following description of each portion of the oil pressure sensor 20 is made for a case where the columnar portion 41 is disposed about the central axis J. As illustrated in FIG. 3, in a state where the sensor case 40 is inserted in the accommodation portion 57, the columnar portion 41 extends from the accommodation portion 57 upward from the wall portion 51 via the accommodation opening portion 57a.

As illustrated in FIG. 4, an outside diameter D1 of the columnar portion 41 is substantially equal to an inside diameter D3 of the first accommodation opening portion 57b. The outside diameter D1 of the columnar portion 41 is slightly smaller than the inside diameter D3 of the first accommodation opening portion 57b. The outside diameter D1 of the columnar portion 41 is larger than the dimension L1 of the gap 58 between the guide protrusion portions 50 adjacent to each other in the circumferential direction. In other words, the dimension L1 is smaller than the outside diameter D1 of the columnar portion 41.

As illustrated in FIG. 3, the columnar portion 41 has an annular seal groove portion 46 recessed upward from a lower surface of the columnar portion 41. The seal groove portion 46 has an annular shape about the central axis J. By providing the seal groove portion 46, a protrusion portion 45 protruding on a lower side is provided on an inside of the seal groove portion 46. The protrusion portion 45 is provided with a sensing hole 45a that is recessed upward from the lower surface of the protrusion portion 45 and connected to an accommodation space 40d to be described below. In other words, the sensor case 40 has the sensing hole 45a on the lower surface of the sensor case 40. The sensing hole 45a is connected to the oil passage opening portion 12 in a state where the oil pressure sensor 20 is attached to the upper surface 11a of the oil passage body 11. The O-ring 24 is disposed in the seal groove portion 46. The O-ring 24 seals between the upper surface 11a of the oil passage body 11 and the sensor case 40.

The plurality of flange portions 42 protrude to an outside from the columnar portion 41 in the radial direction. More specifically, the plurality of flange portions 42 protrude to an outside from the lower end portion of the columnar portion 41 in the radial direction. As illustrated in FIG. 1, the plurality of flange portions 42 are disposed with a gap in the circumferential direction. In the present embodiment, two flange portions 42 are provided so as to interpose the columnar portion 41 therebetween in the radial direction. The flange portion 42 extends in the circumferential direction.

As illustrated in FIG. 4, an outside diameter D2 of the position of the sensor case 40 where the flange portion 42 is provided is larger than the inside diameter D3 of the first accommodation opening portion 57b. In other words, the inside diameter D3 is smaller than the outside diameter D2 of the sensor case 40. The outside diameter D2 of the sensor case 40 is a dimension in the radial direction from an outer end of one side of the flange portion 42 in the radial direction to an outer end of the other side of the other flange portion 42 in the radial direction. In the present embodiment, the outside diameter D2 is the maximum outside diameter among the outside diameters of the sensor case 40.

As illustrated in FIG. 1, a shape of the annular portion 43 is an annular shape that surrounds the columnar portion 41 above the flange portion 42. A shape of the annular portion 43 viewed from the upper side is an annular shape about the central axis J. The annular portion 43 is connected to the columnar portion 41 via the connection portion 44. The annular portion 43 is made of resin, for example. The annular portion 43 has a first portion 43a, a second portion 43b, and a third portion 43c.

Two first portions 43a and two second portions 43b are provided by interposing the columnar portion 41 therebetween in the radial direction. The second portion 43b is disposed between the two first portions 43a in the circumferential direction. The first portion 43a and the second portion 43b each extend in the circumferential direction, respectively. The first portion 43a and the second portion 43b which are adjacent to each other in the circumferential direction are connected to each other via the third portion 43c. A range in the circumferential direction where the two first portions 43a are disposed is substantially the same as a range in the circumferential direction where the two flange portions 42 are disposed. The second portion 43b is disposed below the first portion 43a.

The third portion 43c connects the first portion 43a and the second portion 43b to each other. In the present embodiment, four third portions 43c are provided. The third portion 43c is inclined and extends in a direction to be positioned on the lower side from an end portion on a side connected to the first portion 43a in the circumferential direction toward an end portion on a side connected to the second portion 43b in the circumferential direction.

The connection portion 44 connects an inner circumferential surface of the annular portion 43 and an outer circumferential surface of the columnar portion 41. More specifically, the connection portion 44 connects the inner circumferential surface of the first portion 43a and the outer circumferential surface of the columnar portion 41. Two connection portions 44 are provided in a state of interposing the columnar portion 41 therebetween in the radial direction. The two connection portions 44 are connected to a center of each first portion 43a in the circumferential direction.

As illustrated in FIG. 3, in the present embodiment, the sensor case 40 includes three members of an upper case 40a, a lid portion 40b, and a lower case 40c. The upper case 40a is a portion constituting an upper portion of the columnar portion 41. The annular portion 43 and the connection portion 44 are provided in the upper case 40a. The upper case 40a is a single member made of resin, for example. In other words, the upper portion of the columnar portion 41, the annular portion 43, and the connection portion 44 are portions of the upper case 40a which is a single member.

The lower case 40c is a portion constituting a lower portion of the columnar portion 41. The flange portion 42 is provided in the lower case 40c. The lower case 40c is a single metal member, for example. The lid portion 40b is interposed between the upper case 40a and the lower case 40c in the vertical direction Z in a state of being in contact with the upper case 40a and the lower case 40c.

The accommodation space 40d is provided between the lower case 40c and the lid portion 40b in the vertical direction Z. The accommodation space 40d is partitioned in the vertical direction Z by the diaphragm 23. An upper end of the sensing hole 45a opens in a lower portion of the accommodation space 40d. The sensor main body 21 is installed on a lower surface of the lid portion 40b within the upper portion of the accommodation space 40d. The upper portion of the accommodation space 40d is filled with pressure transmitting liquid. In the mounted state, oil flows into the lower portion of the accommodation space 40d via the sensing hole 45a connected to the oil passage opening portion 12. Pressure of the oil flowing into the lower portion of the accommodation space 40d is applied to the sensor main body 21 via the diaphragm 23 and the pressure transmitting liquid. Accordingly, the oil pressure of the oil in the oil passage 11b can be measured by the sensor main body 21.

The connection terminal 22 extends upward from the upper end of the columnar portion 41. In the present embodiment, for example, three connection terminals 22 are provided. Although not illustrated, the connection terminal 22 is connected to an external device such as a power supply (not illustrated) and electrically connects the external device and the sensor main body 21 to each other.

Figure 5:
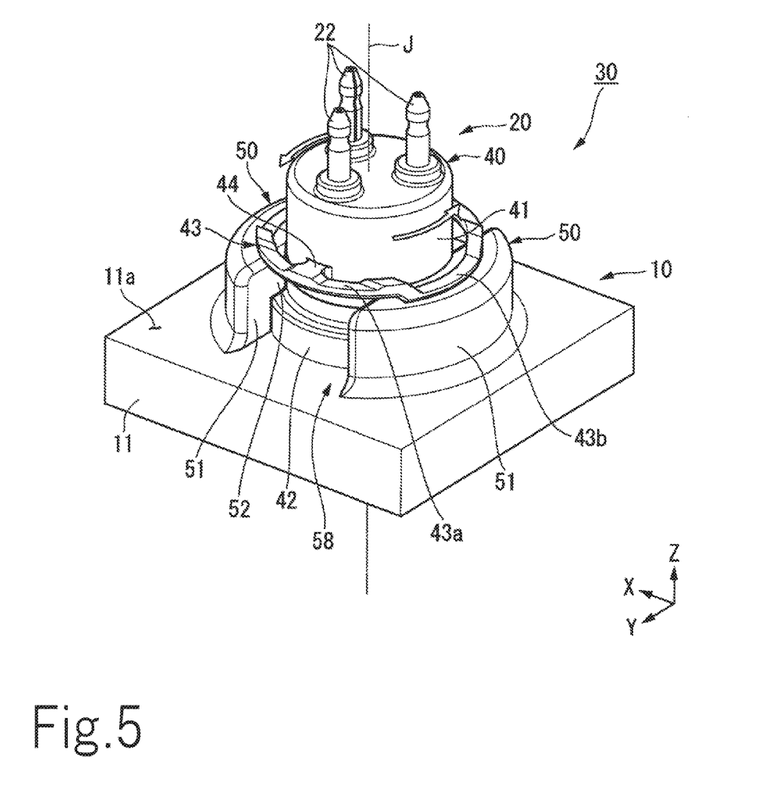
FIG. 5 is a perspective view illustrating the oil pressure sensor attaching structure of the present embodiment.

When the oil pressure sensor 20 is attached to the oil passage body 11 by the oil pressure sensor attaching structure 30, an attacher inserts the oil pressure sensor 20 from the upper side into the accommodation portion 57 as illustrated in FIG. 1. At this time, as illustrated in FIG. 4, a posture of the oil pressure sensor 20 is set to a posture in which the flange portion 42 overlaps the second accommodation openings portion 57c in the vertical direction Z. In other words, in the present embodiment, the attacher sets the oil pressure sensor 20 to a posture in which the direction in which the flange portion 42 protrudes is parallel to the front-rear direction Y and is inserted into the accommodation portion 57 from the accommodation opening portion 57a. As illustrated in FIG. 5, when the oil pressure sensor 20 is inserted into the accommodation portion 57 until the lower surface of the oil pressure sensor 20 is in contact with the upper surface 11a of the oil passage body 11, the second portion 43b of the annular portion 43 becomes a state of being in contact with the upper surface of the guide protrusion portion 50. At this time, the second portion 43b is pressed against the upper surface of the guide protrusion portion 50 and is in a state of being elastically displaced upward. In FIG. 5 a non-mounted state is described.

Next, the attacher rotates the sensor case 40, that is, the oil pressure sensor 20 about the central axis J and moves the position of the flange portion 42 in the circumferential direction to a first position P1 indicated by the two-dot chain line in FIG. 4. Accordingly, the attacher can attach the oil pressure sensor 20 to the oil passage body 11. In other words, the first position P1 is a position of the flange portion 42 in the circumferential direction when the oil pressure sensor 20 is attached to the oil passage body 11. When the oil pressure sensor 20 is rotated about the central axis J, the wall portion 51 extending in the circumferential direction functions as a guide.

As illustrated in FIG. 3, the flange portion 42 is disposed between the upper surface 11a of the oil passage body 11 and the protrusion portion 52 in the vertical direction Z at the first position P1 in the circumferential direction. Thus, the flange portion 42 is caught by the protrusion portion 52 and thus the movement of the oil pressure sensor 20 to the upper side is suppressed. In the present embodiment, in the mounted state, the O-ring 24 is elastically deformed in the vertical direction Z and applies an upward force to the sensor case 40. Therefore, the flange portion 42 is pressed against the protrusion portion 52 from the lower side. At the first position P1, the flange portion 42 faces the wall portion 51 via a gap in the radial direction.

The first portion 43a of the annular portion 43 is positioned above the guide protrusion portion 50 when the flange portion 42 is positioned at the first position P1. In the present embodiment, the first portion 43a is disposed to be spaced apart upward from the upper surface of the guide protrusion portion 50. In other words, when the flange portion 42 is positioned at the first position P1, a gap is provided between the first portion 43a and the upper surface of the guide protrusion portion 50. Therefore, in a state where the oil pressure sensor 20 is attached to the oil passage body 11, wear of the first portion 43a by rubbing against the guide protrusion portion 50 can be suppressed.

When the sensor case 40 moves to the gap 58 between the guide protrusion portions 50 as the sensor case 40 rotates, the second portion 43b of the annular portion 43 restores and moves to a lower side. Accordingly, as illustrated in FIG. 2, when the oil pressure sensor 20 is in a mounted state, that is, when the flange portion 42 is positioned at the first position P1, the second portion 43b is disposed in the gap 58 between the guide protrusion portions 50 adjacent to each other in the circumferential direction. Therefore, when attempting to rotate the oil pressure sensor 20, the second portion 43b or the third portion 43c connecting the first portion 43a and the second portion 43b to each other is in contact with the end portion of the guide protrusion portion 50 in the circumferential direction and thus the rotation of the oil pressure sensor 20 is suppressed. Accordingly, the movement of the flange portion 42 to the position overlapping with the second accommodation openings portion 57c in the vertical direction Z by the rotation of the oil pressure sensor 20 can be suppressed. Therefore, It is possible to suppress the oil pressure sensor 20 from being in a position where the oil pressure sensor 20 is pulled upward via the accommodation openings portion 57a.

As illustrated above, according to the present embodiment, the movement of the oil pressure sensor 20 to the upper side can be suppressed by the flange portion 42, the rotation of the oil pressure sensor 20 can be suppressed by the second portion 43b of the annular portion 43, and pulling of the oil pressure sensor 20 from the accommodation portion 57 can be suppressed. Furthermore, the movement of the oil pressure sensor 20 in the horizontal direction can be suppressed by the plurality of guide protrusion portions 50 disposed surrounding the oil passage opening portion 12.

Accordingly, even in a case where a high pressure is applied to the oil pressure sensor 20 attached to the oil passage body 11 by the oil pressure of the oil, disengagement of the oil pressure sensor 20 from the oil passage body 11 can be suppressed. In addition, since there is no need to use a screw and an attaching member, the size of the oil pressure sensor 20 can be decreased and the number of components of the oil pressure sensor attaching structure 30 can be reduced. Therefore, according to the oil pressure sensor attaching structure 30 of the present embodiment, the increase in size of the entire oil pressure control device can be suppressed while securing the attaching strength of the oil pressure sensor 20. In addition, an increase in the number of components of the oil pressure sensor attaching structure 30 can be suppressed and increase in the manufacturing cost of the oil pressure control device can be suppressed. In addition, since the oil pressure sensor 20 can be attached by inserting the oil pressure sensor 20 from the upper side into the accommodation portion 57 and rotating the oil pressure sensor 20, the oil pressure sensor 20 can be simply and easily attached to the oil passage body 11.

The movement of the oil pressure sensor 20 in the horizontal direction may be suppressed by the columnar portion 41 being in contact with the protrusion portion 52 and the contact between the flange portion 42 and the wall portion 51 with each other may be suppressed.

As illustrated in FIG. 4, in the present embodiment, when the flange portion 42 is positioned at the first position P1, the flange portion 42 faces the wall portion 51 in a direction orthogonal to a direction in which the flange portion 42 protrudes between the horizontal directions, that is, in the front-rear direction in the present embodiment. Therefore, the movement of the oil pressure sensor 20 in the front-rear direction Y can be suppressed. In addition, when the flange portion 42 is positioned at the first position P1, the flange portion 42 faces the wall portion 51 in a direction in which the flange portion 42 protrudes, that is, in the left-right direction X in the present embodiment. Therefore, the movement of the oil pressure sensor 20 in the left-right direction X can be suppressed.

In addition, according to the present embodiment, the inside diameter D3 of the first accommodation opening portion 57b is smaller than the outside diameter D2 of the sensor case in the flange portion 42. Therefore, unless the oil pressure sensor 20 is rotated to bring the sensor case 40 into a posture in which the flange portion 42 overlaps the second accommodation openings portion 57c in the vertical direction Z, the oil pressure sensor 20 cannot be pulled in and out in the vertical direction Z with respect to the accommodation portion 57. Therefore, the oil pressure sensor 20 can be unlikely to be slipped upward from the accommodation portion 57.

In addition, according to the present embodiment, since the protrusion portion 52 extends in the circumferential direction, the protrusion portion 52 can increase a range in the circumferential direction that can suppress the upward movement of the flange portion 42.

In addition, according to the present embodiment, since the number of the guide protrusion portion 50, the flange portion 42, and the second accommodation openings portion 57c is two respectively, the oil pressure sensor attaching structure 30 is likely to be manufactured.

In addition, according to the present embodiment, since the dimension L1 of the gap 58 between the guide protrusion portions 50 is smaller than the outside diameter D1 of the columnar portion 41, the columnar portion 41 cannot pass through the gap 58 in the horizontal direction. Accordingly, the guide protrusion portion 50 can prevent the columnar portion 41 from moving in the horizontal direction. Therefore, the disengagement of the oil pressure sensor 20 from the oil passage body 11 can be further suppressed.

In addition, according to the present embodiment, since the annular portion 43 is made of resin, the annular portion 43 is likely to be elastically displaced when attaching the oil pressure sensor 20 is attached. Accordingly, the oil pressure sensor 20 is likely to be attached.

The present invention is not limited to the embodiment described above and other configurations may be adopted. The oil passage opening portion 12 may not be positioned at a position where the central axis J passes if oil passage opening portion 12 is connected to the sensing hole 45a in the mounted state. In other words, in the embodiment, the positions of the oil passage opening portion 12 and the sensing hole 45a may be shifted about the central axis J.

In addition, the third portion 43c of the annular portion 43 may extend linearly in the vertical direction Z. According to this configuration, in a case where it is attempted to rotate the oil pressure sensor 20 from the mounted state, the end portion of the third portion 43c in the circumferential direction, the end portion of the second portion 43b in the circumferential direction, and the end portion of the guide protrusion portion 50 in the circumferential direction are in contact with each other at surfaces parallel to the vertical direction Z. Therefore, the rotation of the oil pressure sensor 20 can be likely further suppressed.

On the other hand, in a case where the third portion 43c extends obliquely as in the embodiment, the upper end of the end portion of the guide protrusion portion 50 in the circumferential direction is in contact with the inclined surface that is inclined with respect to the third portion 43c in the vertical direction Z. Therefore, when a force is applied to the oil pressure sensor 20 in a rotating direction, the second portion 43b is elastically displaced upward and is likely to ride on the upper surface of the guide protrusion portion 50. Accordingly, the oil pressure sensor 20 is likely to be removed from the oil passage body 11. Since a force received from the oil pressure of the oil by the oil pressure sensor 20 is a force in the vertical direction Z, even in the case described above, unless a force is applied to the oil pressure sensor 20 in an attempt to disengage the oil pressure sensor 20, the rotation of the oil pressure sensor 20 by the second portion 43b can be sufficiently suppressed.

In addition, the number of the guide protrusion portion 50, the flange portion 42, and the second accommodation openings portion 57c may be three or more. In addition, the sensor case 40 may be a single member.

In addition, the oil passage body to which the oil pressure sensor can be attached by the oil pressure sensor attaching structure of the embodiment described above is not particularly limited as long as oil passage body has an oil passage in which the oil flows. The oil pressure sensor attaching structure of the embodiment may be applied to an oil pressure sensor attaching structure for an electric oil pump, for example.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An oil pressure sensor attaching structure in which an oil pressure sensor, which measures pressure of oil flowing in an oil passage through which oil flows, is attached to an upper surface of an oil passage body having the oil passage therein,
   wherein the oil passage body has an oil passage opening portion that is connected to the oil passage on the upper surface,
   wherein the oil pressure sensor has a sensor main body and a sensor case that covers the sensor main body,
   wherein the sensor case has a sensing hole that is connected to the oil passage opening portion on a lower surface of the sensor case in a state where the oil pressure sensor is attached to the upper surface,
   wherein the oil pressure sensor attaching structure includes a plurality of guide protrusion portions which are disposed on the upper surface, and
   the sensor case,
   wherein the plurality of guide protrusion portions are disposed with a gap in a circumferential direction of a central axis extending in a vertical direction and surround the oil passage opening portion,
   wherein the guide protrusion portions have
   an arc-shaped wall portion that protrudes upward from the upper surface and extends in a circumferential direction, and a protrusion portion that protrudes from the wall portion to an inside in a radial direction,
wherein an accommodation portion which has an accommodation opening portion opening upward is provided on an inside of the plurality of guide protrusion portions in the radial direction,
wherein the accommodation portion is capable of accommodating the sensor case from an upper side via the accommodation opening portion and allows the sensor case to be rotated about the central axis in a state where the sensor case is inserted into the accommodation portion,
wherein the sensor case has
a columnar portion that extends from the accommodation portion via the accommodation opening portion to an upper side of the wall portion, in a state where the sensor case is inserted into the accommodation portion,
a plurality of flange portions that protrude from the columnar portion to an outside in the radial direction and are disposed with a gap in the circumferential direction, and
an annular portion that surrounds the columnar portion on an upper side of the flange portion,
wherein the flange portions are positioned between the upper surface and the protrusion portions in the vertical direction at a first position in the circumferential direction, and wherein the annular portion has
a first portion which is positioned on an upper side of the guide protrusion portion when the flange portions are disposed at the first position, and
a second portion which is disposed on a lower side of the first portion and is disposed in the gap between the guide protrusions adjacent to each other in the circumferential direction when the flange portions are positioned at the first position.

2. The oil pressure sensor attaching structure according to claim 1,
wherein the flange portions face the wall portion in a direction orthogonal to a direction in which the flange portions protrude between the horizontal directions when the flange portions are positioned at the first position.

3. The oil pressure sensor attaching structure according to claim 1,
wherein the accommodation opening portion has
a first accommodation opening portion that is disposed in an inside of the protrusion portions in the radial direction and into which the columnar portion can be inserted from the upper side, and
a second accommodation opening portion that is disposed between the protrusion portions of the guide protrusion portion adjacent to each other in the circumference direction and in which the plurality of flange portions can be inserted from the upper side, respectively, and
wherein an inside diameter of the first accommodation opening portion is smaller than an outside diameter of the sensor case at a position in which the flange portions are provided.

4. The oil pressure sensor attaching structure according to claim 3,
wherein the protrusion portions extend in the circumferential direction.

5. The oil pressure sensor attaching structure according to claim 3,
wherein two guide protrusion portions are provided so as to face each other in the first direction between the horizontal directions,
wherein two flange portions are provided so as to interpose the columnar portion therebetween in the radial direction, and
wherein two second accommodation opening portions are provided so as to interpose the first accommodation opening portion therebetween and face each other.

6. The oil pressure sensor attaching structure according to claim 1,
wherein a dimension of the gap between the guide protrusion portions adjacent to each other in the circumferential direction is smaller than an outside diameter of the columnar portion.

7. The oil pressure sensor attaching structure according to claim 1,
wherein the annular portion is made of resin.

* * * * *